United States Patent
Lacouture et al.

(10) Patent No.: US 9,536,622 B2
(45) Date of Patent: Jan. 3, 2017

(54) PROGRAMMING OF ANTIFUSE CELLS

(71) Applicant: STMicroelectronics SA, Montrouge (FR)

(72) Inventors: Stephane Lacouture, Isere (FR); Joel Damiens, Le Touvet (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 14/844,442

(22) Filed: Sep. 3, 2015

(65) Prior Publication Data

US 2016/0078963 A1    Mar. 17, 2016

(30) Foreign Application Priority Data

Sep. 12, 2014    (FR) ..................... 14 58589

(51) Int. Cl.
*G11C 17/16*    (2006.01)
*G11C 16/18*    (2006.01)
*G11C 17/14*    (2006.01)
*G11C 17/18*    (2006.01)
*G11C 5/14*    (2006.01)

(52) U.S. Cl.
CPC ............... *G11C 17/18* (2013.01); *G11C 5/145* (2013.01); *G11C 17/16* (2013.01); *G11C 17/165* (2013.01)

(58) Field of Classification Search
CPC ........ G11C 17/16; G11C 17/18; G11C 17/165
USPC .................................. 365/96, 225.7
See application file for complete search history.

(56) References Cited

U.S. PATENT DOCUMENTS

| | | | |
|---|---|---|---|
| 9,099,175 B1 * | 8/2015 | Hollmer | G11C 13/0002 |
| 2003/0046020 A1 * | 3/2003 | Scheuerlein | G11C 7/04 |
| | | | 702/132 |
| 2005/0001600 A1 * | 1/2005 | Morales | H02M 3/1588 |
| | | | 323/282 |
| 2006/0158923 A1 | 7/2006 | Namekawa et al. | |

OTHER PUBLICATIONS

INPI Search Report and Written Opinion for FR 1458589 mailed Jun. 25, 2015 (8 pages).

* cited by examiner

*Primary Examiner* — Ly D Pham
(74) *Attorney, Agent, or Firm* — Gardere Wynne Sewell, LLP

(57) ABSTRACT

For programming an antifuse memory, the power consumption of the memory is assessed during programming mode. The power consumption is compared with a threshold. When the threshold is exceeded, indicative of successful programming of the antifuse memory cell, the programming mode is terminated.

14 Claims, 3 Drawing Sheets

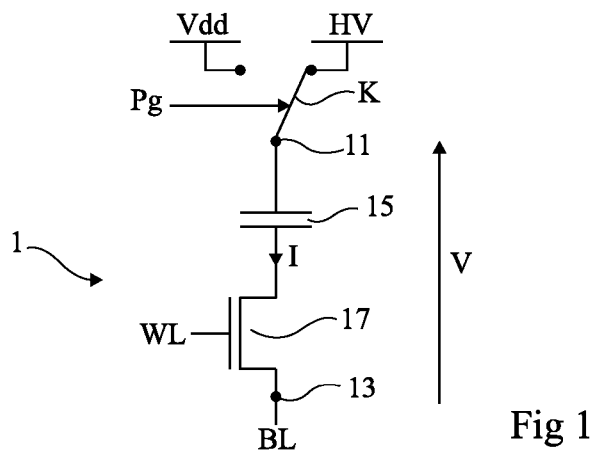
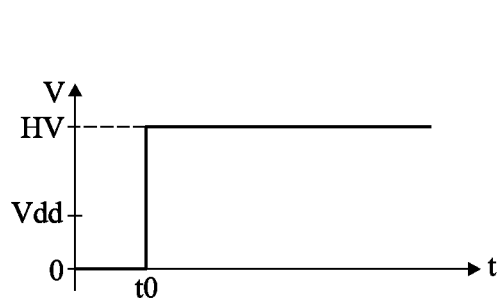
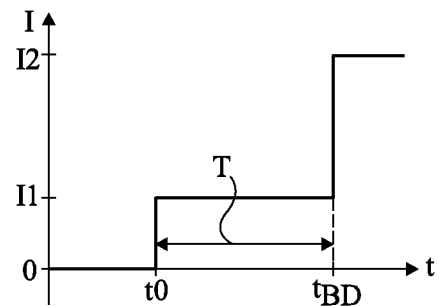
Fig 2A
Fig 2B
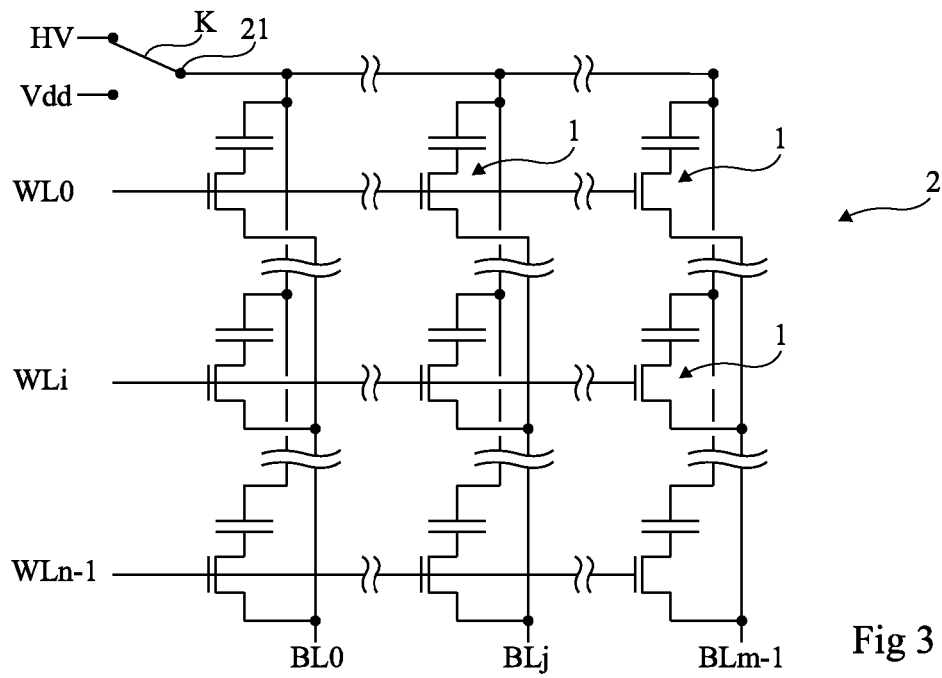
Fig 3

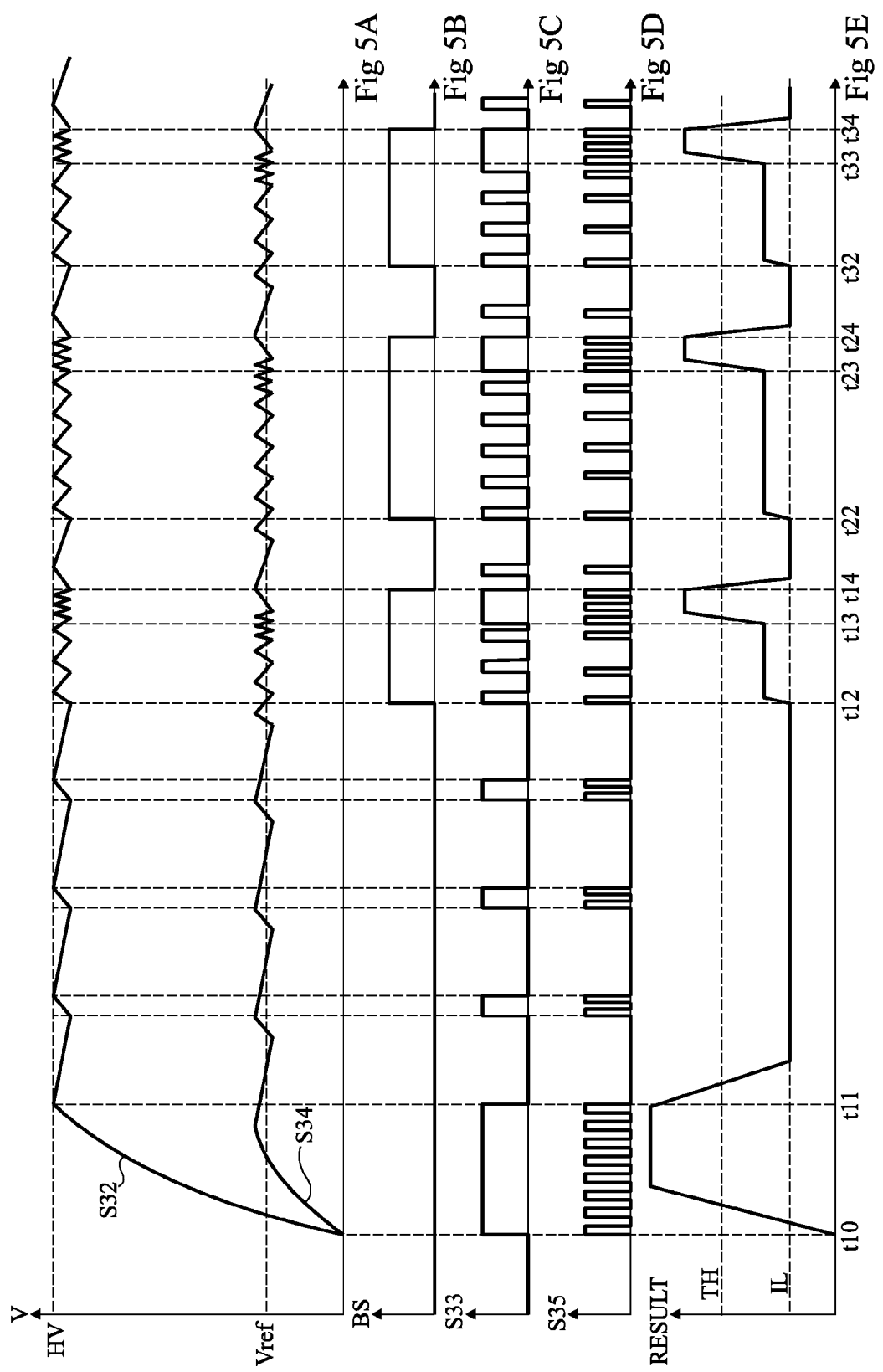

PROGRAMMING OF ANTIFUSE CELLS

PRIORITY CLAIM

This application claims the priority benefit of French Patent application number 1458589, filed on Sep. 12, 2014, the contents of which is hereby incorporated by reference in its entirety to the maximum extent allowable by law.

TECHNICAL FIELD

The present disclosure generally relates to electronic circuits and, more specifically, to one-time programmable (OTP) non-volatile memories of antifuse type. The present disclosure more specifically relates to the programming of such antifuse memory cells.

BACKGROUND

Antifuse memories are memories where each cell comprises an element for storing the conductive or non-conductive state of the cell and a selection MOS transistor. The storage element is, in the applications targeted by the present disclosure, a capacitor-type element, that is, a layer of an insulating material (in practice, a silicon oxide) between two electrodes. The (non-programmed) quiescent state of the cell is a state where the oxide is present. The programmed state of the cell is a state where the oxide has been fused, that is, the storage element then has a resistive behavior instead of a capacitive behavior.

The programming of a memory of this type comprises applying, across the element, a voltage which, given the nature and the thickness of the insulator, exceeds its breakdown voltage to cause the flowing of a current through the insulating layer. This voltage is maintained for a sufficiently long time to "break down" the oxide of the storage element, that is, it enters an irreversible conductive state (resistive behavior).

A difficulty lies in the time required for this programming. Indeed, the time required to break down the cell oxide differs from one cell to the other according to technological dispersions. In a cell array structure, which is the most common structure of antifuse memories, this leads to sizing the programming system so that it applies the programming voltage for a time period corresponding to the worst case.

Namekawa, United States Patent Application Publication No. 2006/0158923, incorporated by reference, discloses a non-volatile semiconductor memory device, and more specifically a method of detecting the breakdown of an antifuse memory based on the voltage of the charge pump. In paragraphs [0039] and [0064], Namekawa refers to a measurement of the programming voltage, and triggers the end of the programming cycle when the voltage reaches a threshold. In Namekawa, the programming voltage varies during the programming sequence, and is interrupted for each bit. Namekawa further teaches, in paragraphs [0082] and [0083], pulse counting to generate a constant delay after the breakdown.

SUMMARY

An embodiment provides an antifuse cell programming technique which overcomes all or part of the disadvantages of usual solutions.

Another embodiment optimizes the programming time of the antifuse cells of an array network.

Another embodiment provides an antifuse cell programming architecture which overcomes all or part of the disadvantages of usual architectures.

Another embodiment provides a solution which is particularly simple to implement.

Thus, an embodiment provides a method of programming an antifuse memory, comprising, for each cell to be programmed, the steps of: assessing the memory power consumption in programming mode; comparing this power consumption with a threshold; and stopping the programming of a cell when the threshold has been reached.

According to an embodiment, a programming voltage, greater than a power supply voltage of the memory in read mode, is applied during the programming.

According to an embodiment, said threshold is adjusted according to a power consumption of the memory plane in the absence of a programming.

According to an embodiment, the consumed current is assessed by counting of the control pulses of a charge pump circuit.

According to an embodiment, the cells to be programmed are successively selected.

An embodiment provides a circuit for programming antifuse cells of a memory comprising: a charge pump circuit capable of delivering, from a first power supply voltage, a second higher programming voltage; a circuit of successive selection of the cells to be programmed; and a circuit for assessing the activity of the charge pump circuit during programming phases.

According to an embodiment, said assessment circuit comprises a synchronous counter of control pulses of the charge pump circuit.

BRIEF DESCRIPTION OF THE DRAWINGS

The foregoing and other features and advantages will be discussed in detail in the following non-limiting description of specific embodiments in connection with the accompanying drawings, wherein:

FIG. 1 shows the electric diagram of an antifuse memory cell;

FIGS. 2A and 2B illustrate, in timing diagrams, examples of respective shapes of the voltage applied to a cell during a programming, and of the corresponding current flowing through the cell;

FIG. 3 is a simplified representation of an antifuse cell array;

FIGS. 5A, 5B, 5C, 5D, and 5E illustrate in the form of timing diagrams an embodiment of the programming method.

DETAILED DESCRIPTION

Figure 4:
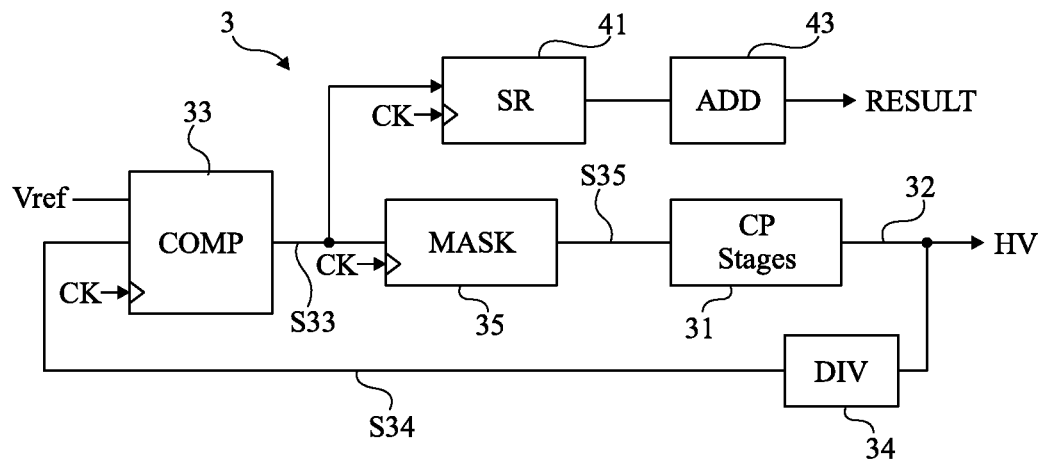
FIG. 4 schematically shows in the form of blocks an embodiment of a circuit for detecting the state of a cell.

The same elements have been designated with the same reference numerals in the different drawings, where the timing diagrams have been drawn out of scale. For clarity, only those steps and elements which are useful to the understanding of the described embodiments have been shown and will be detailed. In particular, the circuits for reading and selecting the respective states of the memory cells in an array network have not been detailed, the described embodiment being compatible with usual solutions. Further, the operation, during a reading of the data that it contains, of an array of antifuse memory cells and the processing of these data have not been detailed either, the described solutions being compatible with the current use of an antifuse memory. Unless otherwise specified, parasitic voltage drops in the conductive elements in the on state are neglected.

An antifuse memory is a non-volatile memory comprising a network of antifuse cells arranged in an array. Such a memory is generally intended to contain data that can be processed by an electronic circuit containing or connected to the antifuse memory. An antifuse memory may be programmed either at the end of a manufacturing or during the memory use. Such a programming comprises applying, across the cell, a voltage greater than the voltage in normal operation to cause the flowing of a current capable of destroying an insulating layer separating two electrodes of the storage element of the cell.

FIG. 1 shows an embodiment of an antifuse cell 1 with its equivalent electric diagram. Cell 1 comprises, in series between a terminal 11 of application of a voltage, positive with respect to a reference voltage (typically the ground), and a terminal 13 of connection to a bit line (generally an array column), a data storage element 15, and a selection MOS transistor 17. The gate of MOS transistor 17 is connected to a selection line or word line WL, generally a row in the array. Storage element 15 is symbolized in the form of a capacitor and is, in practice, made of an oxide thickness between two electrodes, capable of being broken down under the effect of a sufficient electric field. The application of this electric field induces the flowing of an electric current (wearout current) which, in turn, causes the breaking down of the oxide.

In normal operation (reading of the cell), terminal 11 is connected to a power supply voltage Vdd of the electronic circuit having the memory integrated therein, and the bit line is connected to a sense amplifier. When the cell is selected by application to the word line of a voltage greater than the ground voltage (in practice, by connection to power supply voltage Vdd of word line WL), the bit line (terminal 13) sees either its voltage increase (case where storage element 15 has broken down), or its quiescent voltage (generally the ground). Actually, the sense amplifier connected to the bit line detects a variation of the voltage of this line.

To program cell 1, a voltage HV greater than voltage Vdd is applied to terminal 11 and bit line BL (terminal 13) is forced to the reference voltage (the ground). When cell 1 is selected by word line WL, a current I flows therethrough. The level of voltage HV is selected to cause a conduction through the cell oxide and so that current I is sufficient to break down the oxide of storage element 15 after some time.

The selection between the read mode or programming mode Pg is symbolized in FIG. 1 by a switch K selecting the connection of terminal 11 either to voltage Vdd or to voltage HV.

FIGS. 2A and 2B are timing diagrams illustrating the programming of cell 1 of FIG. 1, that is, the switching from a locked state (0) to a conductive state (1). FIG. 2A illustrates voltage V applied across cell 1 (between terminals 11 and 13). FIG. 2B illustrates the corresponding shape of current I flowing through the cell. The effect of the cell connection in its array network is here neglected. The reference voltage is assumed to be the ground (0 volt).

It is assumed that at a time t0, the cell is selected by word line WL and that voltage HV is then applied thereacross. The cell programming starts, that is, its oxide starts leaking and the current reaches a first level I1. After a time interval T, the oxide breakdown occurs at a time $t_{BD}$ and the current in the cell reaches a second level I2 higher than level I1 and corresponding to the programmed state of the cell. Actually, the cell switches from a capacitive non-programmed operation to a resistive programmed operation, its resistance being then low. Once programmed, the cell remains non-volatilely conductive.

A difficulty of the programming of this type of cells is that time period T varies from one cell to the other for a given voltage HV. The higher voltage HV, the shorter time period T, but it remains variable according to cells. Programming time T (breakdown time) is generally called "WearOut time".

A usual programming method comprises sizing the programming time according to the worst case, that is, the longest time necessary for the memory cells of the technology to reach the breakdown. Such a technique has the disadvantage of lengthening the programming time. Another disadvantage is that this decreases the lifetime of the cells, which have a shorter wearout time. Indeed, the longer the high voltage is maintained after the wearout time, the more the cell lifetime is decreased, because of mechanisms of electromigration and aging due to hot carriers, for example. Further, this increases the circuit power consumption.

Another technique comprises performing an iterative programming with short pulses. Voltage HV is applied to the cell for a short time, selected to approximately correspond to the time necessary to program the fastest cells, after which the cell state is read to verify whether it has actually been programmed. If the answer is yes, the process proceeds to the programming of the next cells. If the answer is no, the application of the high-voltage pulse is repeated, and so on.

A disadvantage of this technique is that time is lost due to switching between read phases and programming phases. Further, it is difficult to select an optimal pulse time. FIG. 3 very schematically shows an example of a memory 2 of antifuse cells of the type illustrated in FIG. 1 in an array layout. In this example, the memory comprises n rows and m columns. Each column comprises n cells 1 connected to a same bit line BLj (j being in the range from 0 to m−1), and m cells 1 of a same row share a same word line WLi (i being in the range from 0 to n−1). Each cell 1 has a structure similar to that described in relation with FIG. 1.

Generally, all the cells of the memory plane are interconnected to a common terminal 21 having either read voltage Vdd or programming voltage HV applied thereto. In other words, the terminals 11 of all the array cells are interconnected to a terminal 21 and switch K is common to all cells.

Each bit line BLi is connected to a sense amplifier and to a selection circuit (not shown) between a reading and an application of the reference voltage in programming phases.

To detect the end of the programming of a given cell, it may be envisaged to apply programming voltage HV to the memory plane and then to measure the current at the level of bit lines BL to detect time $t_{BD}$ of programming of the selected cell by word line WL and then stop the programming (deselect the cell). However, due to the array layout of the cells, the current in the bit line corresponds not only to the current in the cell being programmed but also to possible leakages in the non-selected cells connected to this same bit line. The implementation of such a technique would require a complex differential measurement to distinguish the programming current from the leakages of the cells of the bit line having a storage element which has already broken down. This would further require adding a current measurement circuit on each bit line or adding switches enabling to connect each bit line to a common current measurement circuit.

An embodiment of the present disclosure provides detecting the breaking down of the cell oxide at the level of its terminal 11, that is, at the level of node 21 of the array. There already results from the choice to perform the detection on the side of terminal 11 of the cell rather than on the side of terminal 13 that since the high-voltage node is shared by the entire array network, a single detection device is sufficient for the entire memory plane and no additional device is required to select the cell.

Terminal 21 of the array network is, in programming mode, connected to the output of a charge pump circuit having the function of generating voltage HV from voltage Vdd. In the embodiment which will be described hereafter, it is provided to use the charge pump to detect the programming.

FIG. 4 is a block diagram showing an embodiment of a charge pump circuit 3 comprising elements for implementing the cell programming detection method.

A charge pump circuit 3 is generally based on a network of switchable capacitors 31 (CP Stages) having an output terminal 32 intended to deliver voltage HV. Network 31 is activated or controlled by a pulse train having each rising edge causing a charge transfer to output terminal 32 and having its period controlled by the memory plane consumption. To achieve this, a comparator 33 (COMP) receives, on a first terminal, a reference voltage Vref (smaller than level Vdd), on a second terminal, data representative of the level of voltage HV and, on a third terminal, a clock signal CK. Since voltage HV is much greater than power supply voltage Vdd of circuit 33 (in practice, generally by a ratio in the range from 2 to 5), a voltage divider 34 (DIV), for example formed of two resistors R1 and R2 in series between terminal 32 and the ground, having its midpoint connected to the input of comparator 33, decreases the level of the data applied to the comparator input. The output of comparator 33 switches between a high state and a low state according to the output voltage level relative to the selected reference level Vref. This output is in practice combined with clock signal CK (for example, by an AND-type function 35 (MASK)) having its output controlling network 31 of switched capacitances.

What has been described hereabove in relation with charge pump circuit 3 corresponds to a usual structure. The value of high output voltage HV corresponds to ratio Vref (R1+R2)/R2.

The frequency of the control pulses of stage 31 of switched capacitances varies along with the memory plane power consumption.

It is provided to take advantage of this architecture to detect the programming of a cell. Indeed, when a cell switches from the transient state where it is crossed by current I1 (FIG. 2B) to the programmed state (current I2), the memory power consumption, and thus the frequency of the charge pump circuit pulses, increases. This enables to detect the programming and to stop it at the optimal time.

According to an embodiment, to determine, by means of the charge pump circuit, the time when a cell is programmed, clock pulse counting circuits are added to circuit 3. For example, a shift register 41 (SR) receives, on its data input, signal S33 output by comparator 33 and, on its clock input, clock signal CK processed by comparator 33 and function 35. Register 41 is loaded in series at the rate of clock CK and is read in parallel. It comprises p bits. The number of bits at state "1" delivered by shift register 41 is representative of the number of control pulses of the charge pump circuit over the time interval corresponding to the last p clock periods CK. Number p (for example, in the range from 8 to 64) of bits of register 41 is selected to optimize the system accuracy-vs.-rapidity tradeoff. Indeed, number p defines the number of different values capable of being taken by the circuit output. Further, the circuit, by adding the number of pulses over p periods of signal CK, provides an average over this interval. This operation can be compared to a low-pass filter having a cut-off frequency inversely proportional to p.

In the example of FIG. 4, the outputs of shift register 41 are sent to an adder 43 (ADD). The output of adder 43 delivers a result RESULT representative of the activity of the charge pump circuit.

A synchronous counter is actually formed. The higher the number p, the more accurate the counter, but the slower the detection is performed. It can be considered that the average current delivered by the charge pump corresponds to signal RESULT, multiplied by total charge Q of the capacitances of stage 31 of the charge pump (approximately corresponding to the product of the charge pump capacitances multiplied by voltage Vdd) and divided by the product of clock period CK by number p.

FIGS. 5A, 5B, 5C, 5D, and 5E are timing diagrams illustrating the operation of the detection method by means of the charge pump circuit. FIG. 5A shows an example of the shape of voltage V applied to terminal 21 of the array network. FIG. 5B illustrates the state of a bit selection signal BS in the array. This signal for example represents a successive selection of cells to be programmed. For example, for the programming of a word line, a line WLi (FIG. 3) sees its terminal connected to power supply Vdd and bit lines BL0 to BLm−1 corresponding to cells 1 to be programmed are successively grounded. FIG. 5C illustrates an example of a curve corresponding to pulse train S33 at the output of amplifier 33. FIG. 5D illustrates an example of a corresponding curve of pulse train S35 at the output of circuit 35. FIG. 5E illustrates the corresponding shape of signal RESULT (which actually corresponds to the shape of the current at terminal 21). This result is a digital result. Actually, signal RESULT amounts to providing a value indicative of the consumed current I and thus digitally follows the same curve as signal I.

It is assumed that at a time t10, the high-voltage signal is applied to the cell array. The application of the high voltage comes along with a starting phase during which a relatively high current is sampled from the charge pump. This current corresponds to the charge of all the respective capacitances of cells 1 to take their electrodes on the side of terminal 21 to level HV. At the end of this starting phase (time t11), the level of current I sampled from the power supply decreases to a level IL corresponding to the level of the leakages introduced by the different cells programmed to state 1. When the memory plane is in this state, the programming can start. As illustrated in FIGS. 5C and 5D, signal S35 delivers a pulse train at the rate of clock CK during periods identified by signal S33.

Once the starting phase is over (after time t11), signal S33 activates the charge pump when signal S34 decreases below level Vref to recharge the capacitive elements.

For example, a cell is selected at a time t12 (signal BS). This results in a slight increase of the current sampled from the power supply ("wearout" phase). On the side of signal S35, pulses of shorter duration but closer to one another than during charge pump phases between times t11 and t12 can be observed. At a time t13, the cell is programmed and the consumed current is then increased since this cell is selected in the memory plane and becomes conductive. The time interval between times t12 and t13 corresponds to the period (T, FIG. 2B) necessary to program the considered cell.

Signal RESULT, which gives an image of the activity of the charge pump, may also be considered as an image of the current in the memory plane.

A threshold TH from which the programmed cell is considered is determined. Once this threshold has been reached, the cell selection is stopped (time t14) at the level of signal BS, which makes it possible to program a next cell.

The example of FIGS. 5A to 5E assumes a programming start at a time t22 triggered by a switching of signal BS and an end of programming at a time t24. It is assumed that the interval between times t22 and t23 corresponding to the breaking down of the considered cell is greater than the time interval between times t12 and t13, which means that the second cell has programmed slower. The programming carries on in this manner. FIGS. 5A to 5E show a third example (times t32, t33, and t34) where the programming of a third cell having a programming time intermediate between that of the two previous ones is assumed.

Between two programming operations (between times t14 and t22 and between times t24 and t32), hold phases such as between times t11 and t12 can be encountered. It is now thus no longer necessary to wait for a fixed time period between the programming of the different cells.

Figure 6:
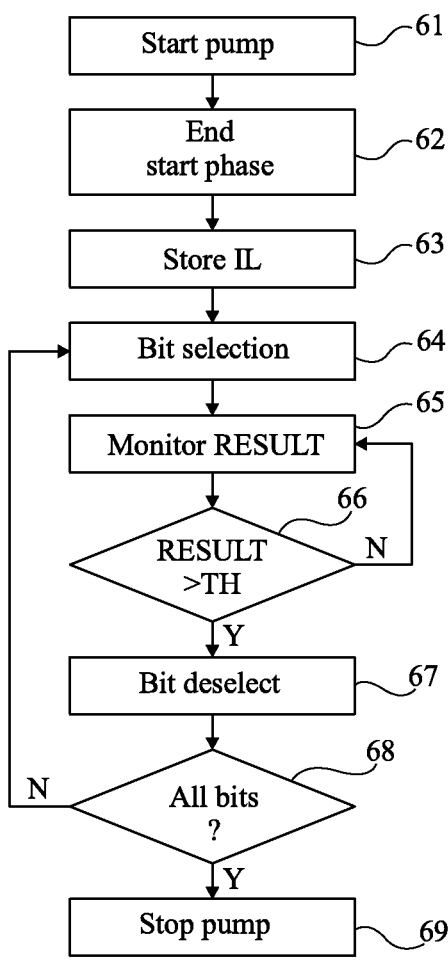
FIG. 6 schematically shows in the form of blocks steps of an embodiment of the programming method.

FIG. 6 is a block diagram illustrating the implementation of the above-described programming method. In a first step (block 61, Start pump), the charge pump is started to deliver high voltage HV.

The appearing of the end of the start phase is monitored (block 62, End start phase). Such a monitoring is for example performed by detecting (time t11, FIG. 5D) a decrease in the activity of the charge pump.

After this, the value delivered by the counter, which represents the leakage level in the charge pump, is stored (block 63, Store IL).

Once these initialization steps have been carried out, the actual programming and detection can start. To achieve this, a bit to be programmed is selected (block 64, Bit selection). After this, the variation of signal RESULT (block 65, Monitor RESULT) is monitored until this signal exceeds threshold TH (block 66, result >TH?). Once this threshold has been reached, the concerned bit is deselected (bloc 67, Bit deselect). As long as there remain non-programmed bits (output N of block 68, All bits?), it is returned to the selection of the next bit (block 64). Once all the bits have been programmed (output Y of block 68), the charge pump can be stopped (block 69, Stop pump).

According to an embodiment, it is considered that the variation amplitude of the current in the cell, when it becomes programmed, is greater than the sum of the possible leakages in the memory plane. In this case, the step of storing value Il can be omitted and threshold TH is a constant threshold.

According to another embodiment, the subtraction of signal RESULT and value IL stored during the initialization is performed. An advantage of this embodiment is that it enables to perform a differential processing taking into account possible variations of the leakage level. This amounts to setting a threshold TH which varies according to value IL.

According to an alternative embodiment, a calibration circuit may be used to take into account the variations of power supply voltage Vdd. Indeed, voltage variations will result in variations of the rate of the charge pump since the charges delivered by the pump are approximately proportional to power supply Vdd. Accordingly, it is preferable to take this into account. For example, it may be provided to correct the result of the charge pump according to the value of voltage Vdd. Such a correction may be performed in ranges, for example, by assigning a same (multiplication) coefficient for correcting value RESULT for a range of values of voltage Vdd.

An advantage of the described embodiments is that it is now possible to optimize the programming time of an antifuse cell array.

Another advantage is that the lifetime of cells having short programming times as compared with others is preserved.

Another advantage is that the circuit power consumption is decreased.

Another advantage is that the implementation requires no action on the actual memory plane and, in particular, no measurement at the level of the bit lines. The only adaptation is the generation of selection signals (symbolized by signal BS) according to the detection results.

The implementation described herein bases the detection on current. The charge pump provides a fixed voltage. Monitoring the output current of the charge pump provides the advantage of avoiding any lost time between programming cycles for starting and stopping the charge pump.

Additionally, the analysis includes deducting the consumption of the memory array that is not selected.

Furthermore, the disclosed embodiments do not measure the programming voltage. Instead, by counting the number of pulses of the regulating circuit, an image of the current, which is drawn from the output of the charge pump, is obtained. This current is used to measure first the power consumption of the non-selected memory array, which will be, in a second step, deducted from the current measurement. The result is that the breakdown of a memory cell is detected by the reaching of a current threshold.

Various embodiments have been described. Various alterations and modifications will occur to those skilled in that art. In particular, the selection of number p of bits of the synchronous counter is within the abilities of those skilled in the art according to a tradeoff between the desired detection rapidity and the desired accuracy. Further, what has been described in relation with a charge pump circuit operating on a rising clock signal transposes to a charge pump circuit operating on a falling or on a rising and falling edge.

Further, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of programming an antifuse memory, comprising, for a cell to be programmed, the steps of:
   counting a number of control pulses of a charge pump circuit;
   generating from the counted number of control pulses a signal having a value that changes over time to indicate consumed current of the antifuse memory in a memory programming mode;
   comparing the changing value of the signal with a threshold; and stopping the programming of the cell when said comparing indicates that the threshold has been reached.

2. The method of claim 1, further comprising applying a programming voltage, greater than a power supply voltage of the antifuse memory in read mode, during the programming.

3. The method of claim 1, further comprising adjusting said threshold according to a power consumption of the antifuse memory in the absence of programming.

4. The method of claim 1, wherein the charge pump circuit is configured to deliver a programming voltage to the antifuse memory during programming of the cell.

5. The method of claim 1, further comprising successively selecting cells of the antifuse memory to be programmed.

6. An antifuse memory cell programming circuit, comprising:
   a charge pump circuit configured to deliver, from a first power supply voltage, a second higher programming voltage;
   a circuit configured to successively select cells to be programmed;
   a circuit configured to count control pulses of the charge pump circuit during programming of a cell and generate a signal having a value that increases over time in response to consumed current by said cell during programming; and
   a control circuit configured to stop programming of the cell when the increasing value of said signal exceeds a threshold.

7. The circuit of claim 6, wherein said circuit configured to count comprises a synchronous counter of said control pulses.

8. A method of programming an antifuse memory cell, comprising:
   applying a boosted voltage generated by a charge pump circuit to said antifuse memory cell during programming mode;
   comparing the boosted voltage to a first threshold;
   generating control pulses for said charge pump circuit in response to the comparison;
   counting a number of said control pulses generated during a testing period of time during programming mode; and
   stopping programming mode when the counted number of control pulses exceeds a second threshold.

9. An antifuse memory cell programming circuit, comprising:
   a charge pump circuit configured to deliver a boosted voltage to an antifuse memory cell during programming mode;
   a comparator configured to compare the boosted voltage to a first threshold;
   a control pulse generator circuit configured to generate control pulses for controlling operation of said charge pump circuit;
   a counter circuit configured to count a number of said control pulses generated during a testing period of time during programming mode and terminate programming mode when the counted number of control pulses exceeds a second threshold.

10. A method of programming an antifuse memory, comprising, for a cell to be programmed, the steps of:
    determining whether a boosted voltage in excess of a power supply voltage applied to the antifuse memory during programming exceeds a voltage threshold;
    assessing a power consumption of the antifuse memory in a memory programming mode by counting a number of control pulses of a charge pump circuit to determine a value indicating consumed current;
    comparing the value indicating consumed current with a threshold; and
    stopping the programming of the cell when said comparing indicates that the threshold has been reached.

11. A method of programming an antifuse memory, comprising, for a cell to be programmed, the steps of:
    assessing a power consumption of the antifuse memory in a memory programming mode by counting a number of control pulses of a charge pump circuit to determine a value indicating consumed current;
    comparing the value indicating consumed current with a threshold;
    stopping the programming of the cell when said comparing indicates that the threshold has been reached; and
    adjusting said threshold according to a power consumption of the antifuse memory in the absence of programming.

12. The method of claim 11, further comprising applying a programming voltage, greater than a power supply voltage of the antifuse memory in read mode, during the programming.

13. The method of claim 11, wherein the charge pump circuit is configured to deliver a programming voltage to the antifuse memory during programming of the cell.

14. The method of claim 11, further comprising successively selecting cells of the antifuse memory to be programmed.

* * * * *